US010665455B2

(12) United States Patent
Lu et al.

(10) Patent No.: US 10,665,455 B2
(45) Date of Patent: May 26, 2020

(54) METHOD (AND RELATED APPARATUS) THAT REDUCES CYCLE TIME FOR FORMING LARGE FIELD INTEGRATED CIRCUITS

(71) Applicant: Taiwan Semiconductor Manufacturing Co., Ltd., Hsin-Chu (TW)

(72) Inventors: Wen-Chen Lu, Zhubei (TW); Ming-Chang Hsieh, Jhudong Township (TW); Yi-Min Chen, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 16/190,757

(22) Filed: Nov. 14, 2018

(65) Prior Publication Data

US 2020/0126785 A1 Apr. 23, 2020

Related U.S. Application Data

(60) Provisional application No. 62/748,699, filed on Oct. 22, 2018.

(51) Int. Cl.
*H01L 21/027* (2006.01)
*H01L 21/768* (2006.01)
(Continued)

(52) U.S. Cl.
CPC .... *H01L 21/0274* (2013.01); *H01L 21/76816* (2013.01); *H01L 21/76877* (2013.01);
(Continued)

(58) Field of Classification Search
CPC .......... H01L 21/0274; H01L 21/76816; H01L 21/76892; H01L 21/76877; H01L 23/528; H01L 23/5226
See application file for complete search history.

(56) References Cited

U.S. PATENT DOCUMENTS 9,140,999 B2 9/2015 Van Der Veen et al.
2007/0178389 A1 8/2007 Yoo
(Continued)

FOREIGN PATENT DOCUMENTS

TW 201535069 A 9/2015

OTHER PUBLICATIONS

Canon. "Steppers." The date of publication is unknown. Retrieved online on Nov. 14, 2018 from https://www.usa.canon.com/internet/portal/us/home/products/list/litho-products/steppers/steppers/.
(Continued)

*Primary Examiner* — Joseph C. Nicely
(74) *Attorney, Agent, or Firm* — Eschweiler & Potashnik, LLC

(57) ABSTRACT

In some embodiments, a method for forming an integrated circuit is provided. The method includes forming a first layer over a semiconductor wafer, the first layer having a first portion and a second portion. The first portion is patterned by projecting a first image field over the first portion of the first layer, where the first portion of the first layer corresponds to the first image field. The second portion is patterned by projecting a second image field over the second portion of the first layer, where the second portion of the first layer corresponds to the second image field. A second layer is formed over the first layer. The second layer is patterned by projecting a third image field over the second layer, where the third image field covers a majority of the first portion and a majority of the second portion of the first layer.

20 Claims, 8 Drawing Sheets

(51) Int. Cl.
    *H01L 23/528*     (2006.01)
    *H01L 23/31*      (2006.01)
    *H01L 23/522*     (2006.01)
    *G03F 7/20*       (2006.01)
    *H01L 21/8234*    (2006.01)

(52) U.S. Cl.
    CPC .. *H01L 21/76892* (2013.01); *H01L 21/76895* (2013.01); *H01L 23/3171* (2013.01); *H01L 23/528* (2013.01); *H01L 23/5226* (2013.01); *G03F 7/2022* (2013.01); *H01L 21/823475* (2013.01)

(56) References Cited

U.S. PATENT DOCUMENTS

| | | |
|---|---|---|
| 2010/0047698 A1 | 2/2010 | Lin et al. |
| 2014/0252655 A1 | 9/2014 | Tran et al. |

OTHER PUBLICATIONS

ASML. "Lithography." The date of publication is unknown. Retrieved online on Nov. 14, 2018 from https://www.asml.com/lithography/en/s6562?rid=6760.

ic region, the cycle time for forming the large field IC may be relatively high.

METHOD (AND RELATED APPARATUS) THAT REDUCES CYCLE TIME FOR FORMING LARGE FIELD INTEGRATED CIRCUITS

REFERENCE TO RELATED APPLICATION

This Application claims priority to U.S. Provisional Application No. 62/748,699 filed on Oct. 22, 2018, the contents of which are hereby incorporated by reference in their entirety.

BACKGROUND

Many modern day electronic devices (e.g., digital cameras, optical imaging devices, display panels, etc.) comprise large field integrated circuits (ICs). A large field IC is an IC having a maximum area that is greater than a maximum image field size of the exposure system (e.g., photolithography system). Typically, the large field IC is formed by a step-and-repeat photolithography process that comprises stepping a reticle over a semiconductor wafer. Compared to other ICs, large field ICs may increase the number (or size) of semiconductor devices (e.g., photodetectors, transistors, etc.) on a given die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
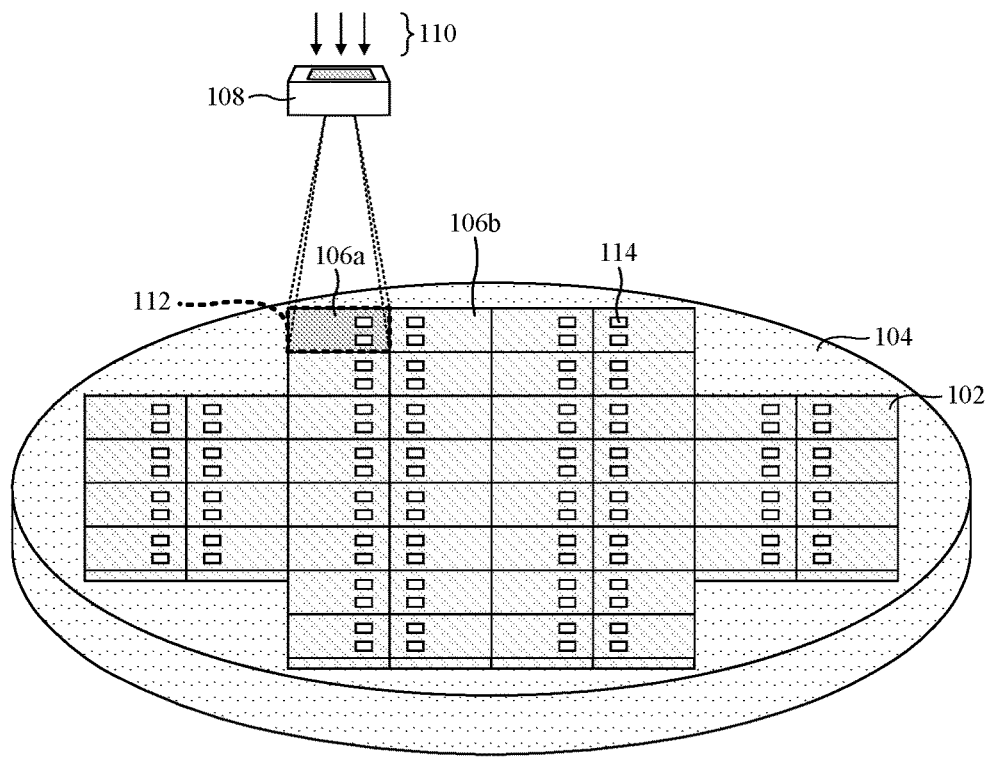
FIGS. 1-2 illustrate a series of perspective views of some embodiments of a method for forming large field integrated circuits (ICs) with reduced cycle time.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A large field integrated circuit (IC) often includes a plurality of integrated circuit units (ICUs) (e.g., a first ICU and a second ICU) electrically coupled together. Generally, the large field IC is formed by a step-and-repeat photolithography process that comprises stepping a reticle over a semiconductor wafer. The step-and-repeat photolithography process includes projecting a first image field toward a first region of the semiconductor wafer by passing radiation through the reticle. Thereafter, the reticle is stepped across the semiconductor wafer, such that radiation may be passed through the reticle to project a second image field toward a second region of the semiconductor wafer. This step-and-repeat photolithography process is repeated multiple times with different reticles to form a first ICU over the first region and a second ICU over the second region of the semiconductor wafer. Typically, during formation of the large field IC, the first ICU is field stitched to the second ICU, such that the first ICU is electrically coupled to the second ICU.

Field stitching the first ICU to the second ICU typically includes forming a stitching region between the first ICU and the second ICU. The stitching region is formed by overlapping the first image field and the second image field. For example, during formation of metal line one of the first ICU, the stitching region is patterned a first time by projecting the first image field toward the first region of the semiconductor wafer. Thereafter, during formation of metal line one of the second ICU, the stitching region is patterned a second time by projecting the second image field toward the second region of the semiconductor wafer. Because the first image field and the second image field are overlapped, metal line one of the first ICU may be electrically coupled to metal line one of the second ICU. This process may be repeated to electrically couple various metal lines of the first ICU to various metal lines of the second ICU. Eventually, a wafer dicing process is performed on the semiconductor wafer such that the first ICU and the second ICU are each included on a single die, corresponding to the large field IC.

A challenge with the above method for forming the large field IC is cycle time. Cycle time is an amount of time to process an IC to completion in a fab. Because the field stitching process requires multiple patternings of the stitching area, the semiconductor wafer must be precisely aligned to ensure the first image field is aligned with the second image field, thereby ensuring the first ICU may be electrically coupled to the second ICU. This precision alignment process increases the cycle time for forming the large field IC. In addition, minimum features sizes in the stitching region are typically relaxed to ensure proper alignment of the first image field and the second image field, thereby reducing the density of semiconductor devices (e.g., photodetectors, transistors, conductive lines, conductive vias, etc.) on the large field IC.

In various embodiments, the present application is directed toward a method that reduces the cycle time for forming a large field IC. The method includes forming a first ICU over a first region of a semiconductor wafer, wherein forming the first ICU comprises projecting a first image field over the first region of the semiconductor wafer by passing radiation through a first reticle. A second ICU is formed over a second region of the semiconductor wafer, wherein forming the second ICU comprises projecting a second image field over the second region of the semiconductor wafer by passing radiation through a second reticle. A dielectric layer is formed over both the first ICU and the second ICU. A conductive layer is formed on the dielectric layer. The conductive layer is patterned to form a patterned conductive layer that electrically couples the first ICU to the second ICU, wherein forming the patterned conductive layer comprises projecting a third image field covering a majority of the first region and a majority of the second region of the semiconductor wafer.

By patterning the conductive layer with the third image field that covers a majority of both the first region and the second region of the semiconductor wafer, the first ICU and the second ICU may be electrically coupled together without overlapping the first image field with the second image field. Thus, the field stitching process may not be required (or a reduced number of field stitching process(es) may be required) to form the large field IC. Accordingly, the cycle time for forming the large field IC may be reduced. In addition, because the field stitching process may not be required, minimum features sizes in the stitching region may not need to be relaxed. Accordingly, the density of semiconductor devices on the large field IC may be increased.

Figure 2:
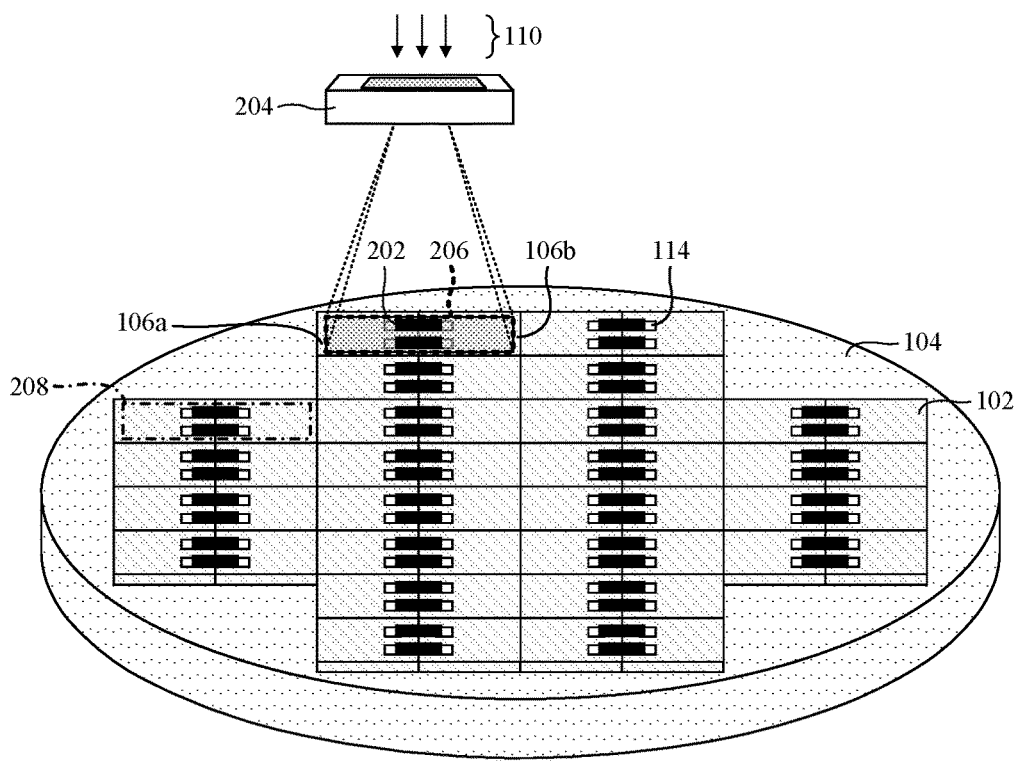

FIGS. 1-2 illustrate a series of perspective views of some embodiments of a method for forming large field integrated circuits (ICs) with reduced cycle time.

As shown in FIG. 1, a first passivation layer 102 having a plurality of openings 114 is formed over a semiconductor wafer 104. In some embodiments, the semiconductor wafer 104 comprises any type of semiconductor body (e.g., monocrystalline silicon/CMOS bulk, silicon-germanium (SiGe), silicon on insulator (SOI), etc.). In some embodiments, the first passivation layer 102 comprises a plurality of portions (e.g., 106a/106b) arranged in an array having a plurality of rows and columns. For example, the first passivation layer 102 comprises a first portion 106a and a second portion 106b arranged adjacent to one another in a first row. In further embodiments, the plurality of portions of the first passivation layer 102 are formed over a plurality of integrated circuit units (ICUs) (not shown), respectively. For example, the first portion of the first passivation layer 106a may be formed over a first ICU, and the second portion of the first passivation layer 106b may be formed over a second ICU.

In some embodiments, a process for forming the first passivation layer 102 comprises forming a dielectric layer (not shown) over the semiconductor wafer 104. A first masking layer (not shown) (e.g., a negative/positive photoresist) is formed on the dielectric layer. A first reticle 108 having a first maximum image field size is positioned at a first location over the first masking layer, the first maximum image field size being a maximum that the first reticle 108 may expose to radiation while projecting a first minimum feature size.

In some embodiments, the first minimum feature size may be less than about 0.5 micrometers (µm). More specifically, the first minimum feature size may be less than about 45 nanometers (nm). In some embodiments, the first maximum image field size may be less than about 2,500 square millimeters ($mm^2$). More specifically, the first maximum image field size may be less than or equal to about 858 ($mm^2$). In such embodiments, the first maximum image field size may have a maximum x-axis dimension less than or equal to about 26 mm and a maximum y-axis dimension (e.g., perpendicular to the x-axis dimension) less than or equal to about 33 mm.

Thereafter, radiation 110 is passed through the first reticle 108 at the first location, such that a first image field 112 is projected onto a first portion of the first masking layer. The first image field 112 comprises a first defined pattern of radiation (e.g., transparently illustrated in FIG. 1) having the first minimum feature size. The radiation 110 reacts with the first masking layer, such that regions of the first making layer exposed to the radiation 110 are more (or less) soluble in a developing agent than regions of the first masking layer that are not exposed to the radiation 110.

In some embodiments, a size/shape of the first portion of the first masking layer corresponds to the first maximum field size projected onto the first masking layer by the first reticle at the first location. In further embodiments, the first portion of the first masking layer is about vertically aligned with the first portion of the first passivation layer 106a. In yet further embodiments, if the first portion of the first masking layer is within a defined overlay tolerance (e.g., about 1 nanometer (nm) to about 300 nm), the first portion of the first masking layer is about vertically aligned with the first portion of the first passivation layer 106a.

Subsequently, the first reticle 108 is stepped across (e.g., via a stepper) the first masking layer to a second location over the first masking layer. Thereafter, radiation 110 is passed through the first reticle 108 to project the first image field 112 of the first reticle 108 onto a second portion of the first masking layer, thereby reacting with the first masking layer. It will be appreciated that, rather than the first reticle being stepped across to the second location, a different reticle having a maximum image field size that is less than or equal to the first maximum image field size may alternatively be positioned at the second location.

In some embodiments, a size/shape of the second portion of the first masking layer corresponds to the first maximum field size projected onto the first masking layer by the first reticle at the second location. In further embodiments, the second portion of the first masking layer is about vertically aligned with the second portion of the first passivation layer 106b. In yet further embodiments, if the second portion of the first masking layer is within the defined overlay tolerance, the second portion of the first masking layer is about vertically aligned with the second portion of the first passivation layer 106b.

In some embodiments, the above process is repeated multiple times to project the first image field 112 onto a plurality of portions of the first making layer, the plurality of portions of the first masking layer being vertically aligned with the plurality of portions of the first passivation layer 102. Thereafter, the first masking layer is developed by exposing the first masking layer to the developing agent to remove portions of the first masking layer that were exposed (or not exposed) to radiation 110. An etching process (e.g., wet or dry etching) is then performed to remove unmasked portions of the dielectric layer (e.g., portions not covered by the developed first masking layer), thereby forming the first passivation layer 102 with the plurality of openings 114 disposed therein. In some embodiments, the openings 114 expose underlying conductive features (e.g., conductive vias, conductive lines, etc.) of the ICUs. Subsequently, the remaining portions of the first masking layer are stripped from the first passivation layer 102.

As shown in FIG. 2, a plurality of patterned conductive layers 202 are formed extending over multiple portions (e.g., 106a/106b) of the first passivation layer 102. For example, one of the patterned conductive layers 202 extends from one of the openings 114 disposed in the first portion of the first passivation layer 106a to one of the openings 114 disposed in the second portion of the first passivation layer 106b. The patterned conductive layers 202 are configured to electrically couple the ICUs together. For example, one or more of the patterned conductive layers 202 electrically couples the first ICU to the second ICU. In some embodiments, the patterned conductive layers 202 may comprise, for example, copper, aluminum, aluminum-copper, some other conductive material, or a combination of the forgoing. In some embodiments, the patterned conductive layers 202 are redistribution layers (RDLs).

In some embodiments, a process for forming the patterned conductive layers 202 comprises forming a conductive layer over the first passivation layer 102 that at least partially fills the openings 114 in the first passivation layer 102. In some embodiments, the conductive layer may comprise, for example, copper, aluminum, aluminum-copper, some other conductive material, or a combination of the forgoing. A second masking layer (not shown) (e.g., a negative/positive photoresist) is formed on the conductive layer. A second reticle 204 having a second maximum field size greater than the first maximum field size is positioned at a third location over the second masking layer, the second maximum image field size being a maximum area that the second reticle 204 may expose to radiation while projecting a second minimum feature size greater than the first minimum feature size.

In some embodiments, the second maximum field size is greater than about 858 mm$^2$. In such embodiments, the second maximum image field size may have a minimum x-axis dimension greater than about 26 mm and a minimum y-axis dimension (e.g., perpendicular to the x-axis dimension) greater than about 33 mm. In further embodiments, the second maximum field size may be greater than or equal to about 2,500 mm$^2$. In such embodiments, the second maximum image field size may have a minimum x-axis dimension greater than or equal to about 50 mm and a minimum y-axis dimension (e.g., perpendicular to the x-axis dimension) greater than or equal to about 50 mm. In further embodiments, the second minimum feature size may be greater than or equal to about 0.5 μm. In yet further embodiments, the second minimum feature size is greater than the first minimum feature size.

Thereafter, radiation 110 is passed through the second reticle 204 at the third location, such that a second image field 206 covering a majority of the first portion 106a and a majority of the second portion of the first passivation layer 106b is projected onto a first portion of the second masking layer. The second image field 206 comprises a second defined pattern of radiation (e.g., transparently illustrated in FIG. 2) having the second minimum feature size. The radiation 110 reacts with the second masking layer, such that regions of the second making layer exposed to the radiation 110 are more (or less) soluble in a developing agent than regions of the second masking layer that are not exposed to the radiation 110.

In some embodiments, a size/shape of the first portion of the second masking layer corresponds to the second maximum field size projected onto the second masking layer by the second reticle at the third location. In further embodiments, the first portion of the second masking layer covers a majority of the first portion 106a and a majority of the second portion of the first passivation layer 106b. In further embodiments, the first portion of the second masking layer has a perimeter that is enclosed by a combined perimeter of the first portion 106a and the second portion of the first passivation layer 106b. In other embodiments, the perimeter of the first portion of the second making layer is about vertically aligned with the combined perimeter of the first portion 106a and the second portion of the first passivation layer 106b.

Subsequently, the second reticle 204 is stepped across the second masking layer to a fourth location over the second masking layer. Thereafter, radiation 110 is passed through the second reticle 204 to project the second image field 206 onto a second portion of the second masking layer, thereby reacting with the second masking layer. It will be appreciated that, rather than the second reticle 204 being stepped across to the fourth location, a different reticle having a maximum image field size that is greater than or equal to the second maximum image field size may alternatively be positioned at the fourth location.

In some embodiments, the above process is repeated multiple times to project the second image field 206 onto a plurality of portions of the second making layer, each of the plurality of portions of the second masking layer covering a majority of multiple portions (e.g., 106a/106b) of the first passivation layer 102. Thereafter, the second masking layer is developed by exposing the second masking layer to a developing agent to remove portions of the second masking layer that were exposed (or not exposed) to radiation 110. An etching process is then performed to remove unmasked portions of the conductive layer, thereby forming the patterned conductive layers 202. In some embodiments, the patterned conductive layers 202 are formed extending between underlying conductive features of individual ICUs (e.g., extending from the first ICU to the second ICU). Subsequently, the remaining portions of the second masking layer are stripped from the patterned conductive layers 202. In further embodiments, forming the patterned conductive layers 202 forms a plurality of large field ICs 208 disposed in an array on the semiconductor wafer 104, each of the large field ICs 208 comprising a plurality of ICUs coupled together by one or more patterned conductive layers 202.

By forming the patterned conductive layers 202 with the second image field 206, the large field ICs 208 may be formed without overlapping the first image field projected at the first location with the first image field projected at the second location. Thus, the large field ICs 208 may be formed without a field stitching process (or by reducing a number of field stitching process(es) needed to form the large field ICs 208). Accordingly, the cycle time for forming the large field ICs 208 may be reduced. In addition, because the large field ICs 208 may be formed without the field stitching process, minimum features sizes may not needed to be relaxed to compensate for the field stitching process. Accordingly, the density of semiconductor devices on the large field IC may be increased.

Figure 3:
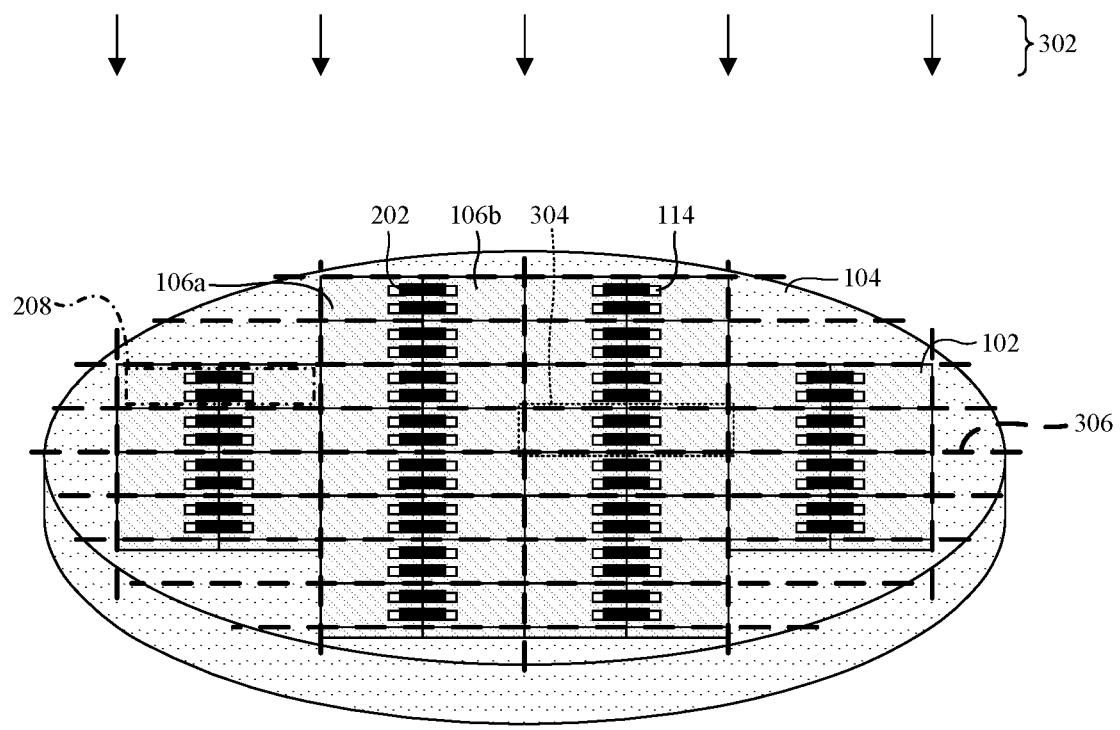
FIG. 3 illustrates a perspective view of some embodiments of the large field ICs of FIG. 2 being singulated into large field dies.

FIG. 3 illustrates a perspective view of some embodiments of the large field ICs of FIG. 2 being singulated into large field dies.

As shown in FIG. 3, a wafer dicing process 302 is performed on the semiconductor wafer 104 singulating the large field ICs 208 from the semiconductor wafer 104 to form large field dies 304, respectively. In some embodiments, the wafer dicing process 302 comprises performing a series of cuts into the semiconductor wafer 104 to form a plurality of scribe lines 306. Subsequently, a mechanical force is applied to the semiconductor wafer 104 to singulate the large field dies 304 from the semiconductor wafer 104. In further embodiments, the cuts may be performed by, for example, mechanical sawing, laser cutting, or the like.

Figure 4:
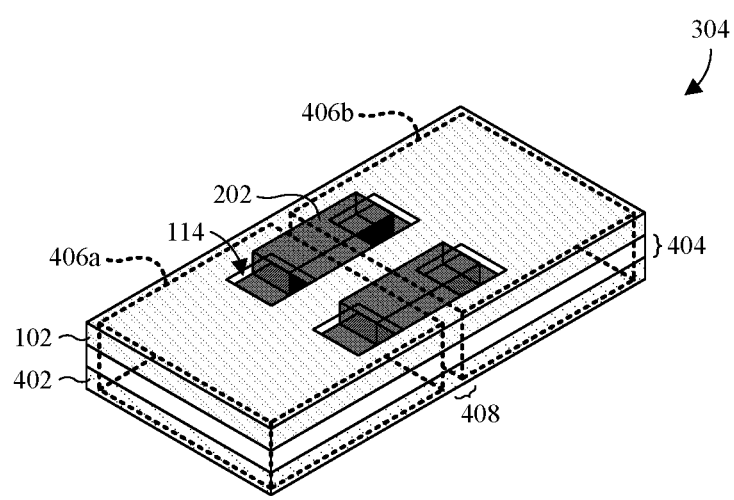
FIG. 4 illustrates a perspective view of some embodiments of a large field die of FIG. 3.

FIG. 4 illustrates a perspective view of some embodiments of a large field die of FIG. 3.

As shown in FIG. 4, the large field die 304 comprises a semiconductor substrate 402. The semiconductor substrate 402 is a portion of the semiconductor wafer 104 that was singulated from the semiconductor wafer 104 during the wafer dicing process 302. In further embodiments, the semiconductor substrate 402 comprises any type of semiconductor body (e.g., monocrystalline silicon/CMOS bulk, silicon-germanium (SiGe), silicon on insulator (SOI), etc.).

Further, the large field die 304 comprises a first ICU 406a and a second ICU 406b. In some embodiments, the first ICU 406a comprises a first plurality of semiconductor devices (not shown) that are interconnected together by a first plurality of conductive features (e.g., metal lines, metal vias, etc.) (not shown). In further embodiments, the second ICU 406b comprises a second plurality of semiconductor devices (not shown) that are interconnected together by a second plurality of conductive features (not shown).

A metallization structure 404 is disposed between the semiconductor substrate 402 and the first passivation layer 102. In some embodiments, the metallization structure 404 comprises the first plurality of conductive features structure and the second plurality of conductive features. In further embodiments, the first ICU 406a and the second ICU 406b may be electrically isolated from one another by an isolation region 408. In yet further embodiments, the isolation region 408 may comprise a region of the metallization structure 404 disposed between the first ICU 406a and the second ICU 406b, and a region of the semiconductor substrate 402 disposed between the first ICU 406a and the second ICU 406b. In yet further embodiments, one or more patterned conductive layers 202 electrically couples the first ICU 406a to the second ICU 406b by bridging the isolation region 408.

Figure 5:
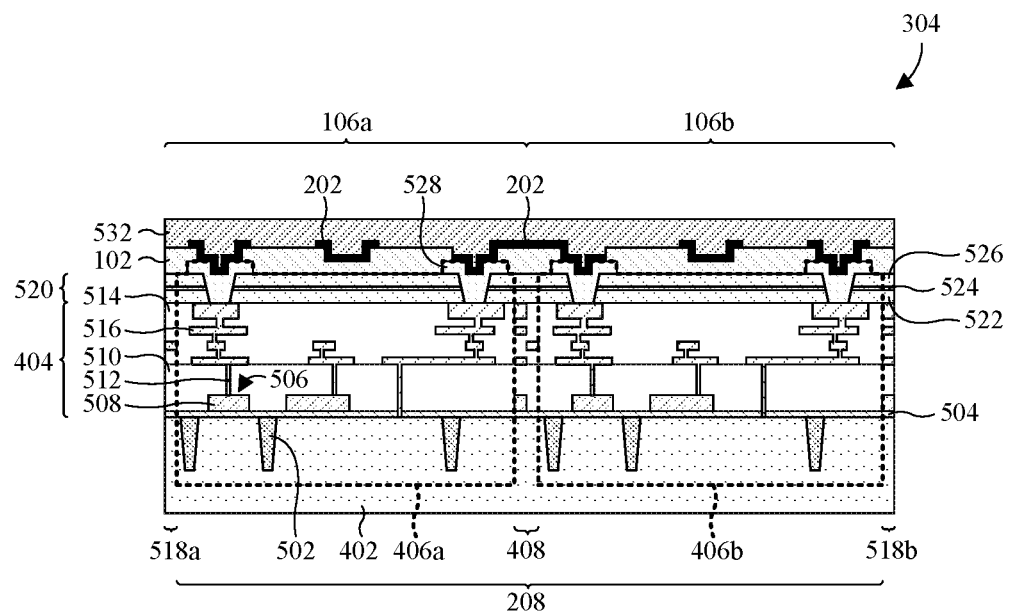
FIG. 5 illustrates a cross-sectional view of some embodiments of the large field die of FIG. 4.

FIG. 5 illustrates a cross-sectional view of some embodiments of the large field die of FIG. 4.

As shown in FIG. 5, a plurality of isolation structures 502 are disposed in the semiconductor substrate 402. In some embodiments, the plurality of isolation structures 502 may comprise, for example, an oxide (e.g., silicon dioxide ($SiO_2$)), a nitride (e.g., silicon nitride (SiN)), an oxy-nitride (e.g., silicon oxynitride ($SiO_XN_Y$)), some other dielectric, or a combination of the foregoing. In further embodiments, the plurality of isolation structures 502 are shallow trench isolation (STI) structures.

A first dielectric layer 504 is disposed over the semiconductor substrate 402. In some embodiments, the first dielectric layer 504 is disposed on the semiconductor substrate 402 and the plurality of isolation structures 502. In further embodiments, the first dielectric layer 504 may comprise, for example, an oxide (e.g., $SiO_2$).

A plurality of semiconductor devices 506 (e.g., a metal-oxide-semiconductor field-effect transistors (MOSFETs)) are disposed over/within the semiconductor substrate 402. In some embodiments, each of the plurality of semiconductor devices 506 comprise a gate electrode 508 disposed on the first dielectric layer 504, and a pair of source/drain regions (not shown) disposed in the semiconductor substrate 402 on opposite sides of the gate electrode 508. In further embodiments, the gate electrodes 508 may comprise, for example, doped polysilicon, fully-silicided polysilicon, a metal (e.g., aluminum, copper, titanium, tantalum, tungsten, molybdenum, cobalt, etc.), or some other conductive material. In further embodiments, the isolation structures 502 may be disposed on opposite sides of the semiconductor devices 506. In yet further embodiments, regions of the first dielectric layer 504 disposed directly beneath the gate electrodes 508 may be referred to as gate dielectrics, respectively.

An interlayer dielectric (ILD) layer 510 is disposed over the semiconductor devices 506 and the first dielectric layer 504. In some embodiments, the ILD layer 510 may comprise one or more of a low-k dielectric layer (e.g., a dielectric with a dielectric constant less than about 3.9), an ultra-low-k dielectric layer, an oxide (e.g., $SiO_2$), or the like. In further embodiments, a plurality of conductive contacts 512 are disposed in the ILD layer 510 and electrically coupled to the semiconductor devices 506. In yet further embodiments, the conductive contacts 512 may comprise, for example, tungsten, copper, or the like. In further embodiments, an inter-metal dielectric (IMD) layer 514 is disposed over the ILD layer 510. In some embodiments, the IMD layer 514 may comprise one or more of a low-k dielectric layer, an ultra-low-k dielectric layer, an oxide (e.g., $SiO_2$), or the like.

In some embodiments, a plurality of conductive features 516 (e.g., metal lines, metal vias, etc.) are disposed in the IMD layer 514 and electrically coupled to the conductive contacts 512. In further embodiments, the conductive features 516 of the first ICU 406a are configured to provide electrical connections between semiconductor devices 506 of the first ICU 406a. In further embodiments, the conductive features 516 of the second ICU 406b are configured to provide electrical connections between semiconductor devices 506 of the second ICU 406b. In further embodiments, the conductive features 516 may comprise, for example, copper, aluminum, or the like. In yet further embodiments, the metallization structure 404 may comprise the ILD layer 510, the IMD layer 514, the conductive contacts 512, and the conductive features 516.

An isolation region 408 is disposed between the first ICU 406a and the second ICU 406b. In some embodiments, the isolation region 408 electrically isolates the first ICU 406a from the second ICU 406b. In further embodiments, the isolation region 408 may comprise a region disposed between the first ICU 406a and the second ICU 406b that extends from a bottom surface of the semiconductor substrate 402 and a bottom surface of the first passivation layer 102.

In some embodiments, the isolation region 408 may comprise conductive features 516, conductive contacts 512, and/or gate electrodes 508. In further embodiments, some of the conductive features 516 disposed in the isolation region 408 may be electrically coupled to the conductive features 516 of the first ICU 406a. In further embodiments, some other conductive features 516 disposed in the isolation region 408 may be electrically coupled to the conductive features 516 of the second ICU 406b. In further embodiments, the some of the conductive features 516 disposed in the isolation region 408 are not electrically coupled to the some other conductive features 516 disposed in the isolation region 408. In yet further embodiments, the some of the conductive features 516 disposed in the isolation region 408 and/or the some other conductive features 516 disposed in the isolation region 408 are not electrically coupled to the first ICU 406a or the second ICU 406b.

In some embodiments, a first peripheral region 518a is disposed on a side of the first ICU 406a opposite the isolation region 408. In further embodiments, a second peripheral region 518b is disposed on a side of the second ICU 406b opposite the isolation region 408. In further embodiments, the first peripheral region 518a and the second peripheral region 518b may comprise conductive features 516, conductive contacts 512, and/or gate electrodes 508. In further embodiments, conductive features 516 of the first peripheral region 518a may be electrically coupled to the conductive features 516 of the first ICU 406a. In yet further embodiments, the conductive features 516 of the second peripheral region 518b may be electrically coupled to the conductive features 516 of the second ICU 406b.

A second passivation layer 520 is disposed over the IMD layer 514 and the conductive features 516. In some embodiments, the second passivation layer 520 comprises a second dielectric layer 522, a third dielectric layer 524, and a fourth dielectric layer 526. In further embodiments, the second dielectric layer 522 may comprise, for example, an oxide (e.g., $SiO_2$). In further embodiments, the third dielectric layer 524 may comprise, for example, a nitride (e.g., SiN). In further embodiments, the fourth dielectric layer 526 may comprise for example, an oxide (e.g., $SiO_2$). It will be appreciated that the second passivation layer 520 may be a single dielectric layer that comprises an oxide (e.g., $SiO_2$), a nitride (e.g., SiN), an oxy-nitride (e.g., $SiO_XN_Y$), or the like.

A plurality of conductive vias 528 are electrically coupled to conductive features 516 of the first ICU 406a and the second ICU 406b. In some embodiments, the conductive vias 528 are disposed over/within the second passivation layer 520. In some embodiments, the conductive vias 528 extend from an upper surface of the second passivation layer 520 to conductive features 516 of the first ICU 406a and the second ICU 406b. In further embodiments, the conductive vias 528 may comprise, for example, aluminum (Al), copper (Cu), tungsten (W), gold (Au), or the like. In yet further embodiments, the conductive vias 528 that are electrically coupled to the conductive features 516 of the first ICU 406a are not electrically coupled to the conductive vias 528 of the second ICU 406b.

In some embodiments, a minimum feature size of the first ICU 406a may be less than or equal to the first minimum feature size. In further embodiments, a minimum feature size of the second ICU 406b may be less than or equal to the first minimum feature size. In further embodiments, the first minimum feature size may be less than about 0.5 micrometers (μm). In further embodiments, the minimum feature size of the first ICU 406a may be substantially the same as the minimum feature size of the second ICU 406b. In other embodiments, the minimum feature size of the first ICU 406a may be different than the minimum feature size of the second ICU 406b. In such embodiments, the minimum feature size of the first ICU 406a and a minimum feature size of the second ICU 406b may be less than the about 0.5 μm.

In some embodiments, a layout of the first ICU 406a may be substantially the same as a layout of the second ICU 406b. In other words, the semiconductor devices 506, the conductive contacts 512, the conductive features 516, and the conductive vias 528 of the first ICU 406a may be disposed in a substantially same layout as the semiconductor devices 506, the conductive contacts 512, the conductive features 516, and the conductive vias 528 of the second ICU 406a. In other embodiments, the layout of the first ICU 406a may be different than the layout of the second ICU 406b. For example, in some embodiments, the first ICU 406a may be a first microprocessor core, and the second ICU 406b may be a second ICU core that is identical to the first ICU 406a, and the patterned conductive layers 202 electrically couple the first ICU 406a to the second ICU 406b.

In some embodiments, the first passivation layer 102 is disposed over the second passivation layer 520. In further embodiments, the first passivation layer 102 is partially disposed over the conductive vias 528. In further embodiments, the first portion of the first passivation layer 106a is disposed over the first ICU 406a, and the second portion of the first passivation layer 106b is disposed over the second ICU 406b. In further embodiments, a region of the first passivation layer 102 is disposed over the isolation region 408 and continuously covers a region of the first ICU 406a, the isolation region 408, and a region of the second ICU 406b. In yet further embodiments, the region of the first passivation layer 102 that is disposed over the isolation region 408 may have an uppermost surface that is disposed over uppermost surfaces of the conductive vias 528.

The plurality of patterned conductive layers 202 are disposed over the first ICU 406a and the second ICU 406b. In some embodiments, one of the patterned conductive layers 202 is configured to electrically couple the first ICU 406a to the second ICU 406b. In some embodiments, the one of the patterned conductive layers 202 electrically couples the first ICU 406a to the second ICU 406b by extending vertically from a conductive via 528 of the first ICU 406a, laterally along the region of the first passivation layer 102 disposed over the isolation region 408, and vertically toward a conductive via 528 of the second ICU 406b. In further embodiments, the patterned conductive layers 202 may comprise, for example, aluminum (Al), copper (Cu), tungsten (W), gold (Au), some other conductive material, or a combination of the foregoing. In yet further embodiments, the patterned conductive layers 202 are redistribution layers (RDLs).

In some embodiments, a minimum feature size of the patterned conductive layers 202 is greater than a minimum feature size of both the first ICU 406a and the second ICU 406b. In further embodiments, the minimum feature size of the patterned conductive layers 202 is the second minimum feature size. In further embodiments, the second minimum feature size is greater than about 0.5 μm. In yet further embodiments, a width of the patterned conductive layers 202 may be the second minimum feature size.

In some embodiments, a third passivation layer 532 is disposed over the first passivation layer 102 and the patterned conductive layers 202. In further embodiments, the third passivation layer may have a substantially planar upper surface. In further embodiments, the third passivation layer 532 may comprise, for example, an oxide (e.g., $SiO_2$), a nitride (e.g., SiN), an oxy-nitride (e.g., $SiO_XN_Y$), or the like. In yet further embodiments, the large field IC 208 comprises the first ICU 406a, the second ICU 406b, the isolation region 408, the patterned conductive layers 202, the first passivation layer 102, and the third passivation layer 532.

Figure 6:
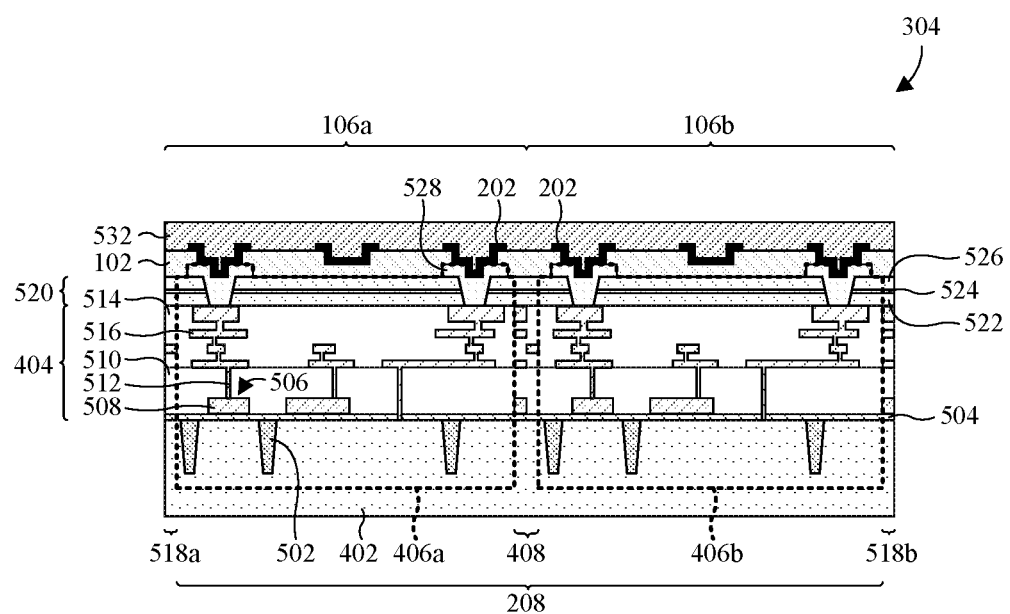
FIG. 6 illustrates a cross-sectional view of some other embodiments of the large field die of FIG. 5.

FIG. 6 illustrates a cross-sectional view of some other embodiments of the large field die of FIG. 5.

As shown in FIG. 6, in some embodiments, the one of the patterned conductive layers 202 does not electrically couple the first ICU 406a to the second ICU 406b. In such embodiments, the large field die 304 may comprise additional ICU(s) (not shown). In further such embodiments, the one of the patterned conductive layers 202 may electrically couple the first ICU 406a and/or the second ICU 406b to the additional ICU(s). For example, the one of the patterned conductive layers 202 may laterally extend (e.g., into the page of FIG. 6) over the first passivation layer 102 to electrically couple the first ICU 406a to a third ICU (not shown), and another one of the patterned conductive layers 202 may extend in parallel with the one of the patterned conductive layers 202 to electrically couple the second ICU 406b to a fourth ICU (not shown).

FIGS. 7-18 illustrate a series of cross-sectional views of some embodiments of a method for forming the large field die of FIG. 5 with reduced cycle time.

Figure 7:
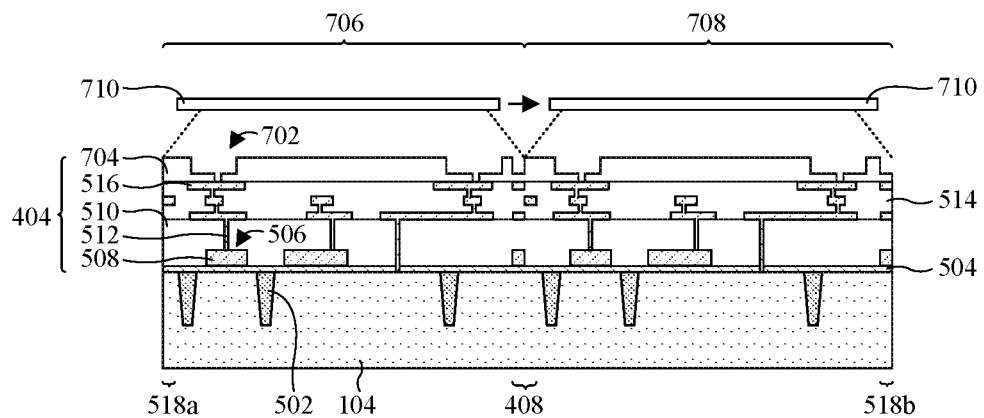
FIGS. 7-18 illustrate a series of cross-sectional views of some embodiments of a method for forming the large field die of FIG. 5 with reduced cycle time.

As shown in FIG. 7, a plurality of upper conductive feature openings 702 are formed in an upper IMD layer 704, the upper IMD layer 704 having a first portion 706 and a second portion 708. In some embodiments, the upper IMD layer 704 may comprise one or more of a low-k dielectric layer, an ultra-low-k dielectric layer, an oxide (e.g., (SiO2), or the like. In further embodiments, a process for forming the upper conductive feature openings 702 comprises performing a first patterning process on the upper IMD layer 704. In yet further embodiments, the first patterning process comprises forming a third masking layer (not shown) (e.g., a negative/positive photoresist) on the upper IMD layer 704. The third masking layer may be formed by, for example, a spin-on process.

A third reticle 710 having a third maximum image field size is positioned at a fifth location over the third masking layer, the third maximum image field size being a maximum area that the third reticle 710 may expose to radiation while projecting a third minimum feature size. In some embodiments, the third minimum feature size may be less than about 0.5 μm. More specifically, the third minimum feature size may be less than about 45 nm. In further embodiments, the third minimum feature size is substantially the same as the first minimum feature size.

In some embodiments, the third maximum image field size may be less than about 2,500 mm². More specifically, the third maximum image field size may be less than or equal to about 858 mm². In such embodiments, the third maximum image field size may have a maximum x-axis dimension less than or equal to about 26 mm and a maximum y-axis dimension (e.g., perpendicular to the x-axis dimension) less than or equal to about 33 mm. In further embodiments, the third maximum image field size is substantially the same as the first maximum image field size.

Thereafter, radiation is passed through the third reticle 710 at the fifth location, such that a third image field is projected onto a first portion of the third masking layer. The third image field comprises a third defined pattern of radiation (e.g., a layout of the upper conductive feature openings 702) having the third minimum feature size. The radiation reacts with the third masking layer, such that regions of the third making layer exposed to the radiation are more (or less) soluble in a developing agent than regions of the third masking layer that are not exposed to the radiation.

In some embodiments, a size/shape of the first portion of the third masking layer corresponds to the third maximum field size projected onto the third masking layer at the fifth location. In further embodiments, the first portion of the third masking layer is about vertically aligned with the first portion of the upper IMD layer 706. In yet further embodiments, if the first portion of the third masking layer is within a defined overlay tolerance (e.g., about 1 nanometer (nm) to about 300 nm), the first portion of the third masking layer is about vertically aligned with the first portion of the upper IMD layer 706.

Subsequently, the third reticle 710 is stepped across (e.g., via a stepper) the third masking layer to a sixth location over the third masking layer. Thereafter, radiation is passed through the third reticle 710 to project the third image field onto a second portion of the third masking layer, thereby reacting with the third masking layer. It will be appreciated that, rather than the third reticle being stepped across to the sixth location, a different reticle having a maximum image field size that is less than or equal to the third maximum image field size may alternatively be positioned at the sixth location to project a different image field onto the second portion of the third masking layer.

In some embodiments, a size/shape of the second portion of the third masking layer corresponds to the third maximum field size projected onto the third masking layer by the third reticle 710 at the sixth location. In further embodiments, the second portion of the third masking layer is about vertically aligned with the second portion of the upper IMD layer 708. In yet further embodiments, if the second portion of the third masking layer is within the defined overlay tolerance, the second portion of the third masking layer is about vertically aligned with the second portion of the upper IMD layer 708.

Thereafter, the third masking layer is developed by exposing the third masking layer to the developing agent to remove portions of the third masking layer that were exposed (or not exposed) to the radiation. An etching process (e.g., wet or dry etching) is then performed to remove unmasked portions of the upper IMD layer 704 (e.g., portions not covered by the developed third masking layer), thereby forming the plurality of upper conductive feature openings 702 in the upper IMD layer 704. Subsequently, the remaining portions of the third masking layer are stripped from the upper IMD layer 704.

Figure 8:
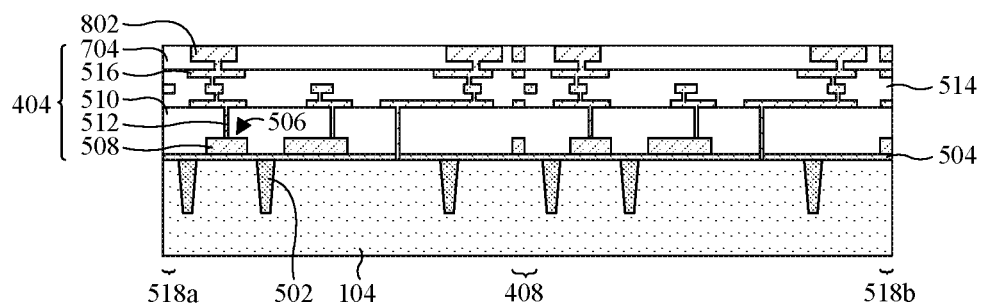

As shown in FIG. 8, a plurality of upper conductive features 802 are formed in the upper IMD layer 704. In some embodiments, a process for forming the upper conductive features 802 comprises depositing a conductive layer (not shown) on the upper IMD layer 704 and filling the upper conductive feature openings 702 (see, e.g., FIG. 7). Subsequently, a planarization process (e.g., a chemical-mechanical planarization (CMP)) is performed on the conductive layer and into the upper IMD layer 704 to form the upper conductive features 802. In some embodiments, the conductive layer may comprise, for example, copper, aluminum, or the like. In further embodiments, the conductive layer may be deposited by, for example, chemical vapor deposition (CVD), physical vapor deposition (PVD), atomic layer deposition (ALD), sputtering, electrochemical plating, electroless plating, some other deposition process, or a combination of the foregoing.

Figure 9:
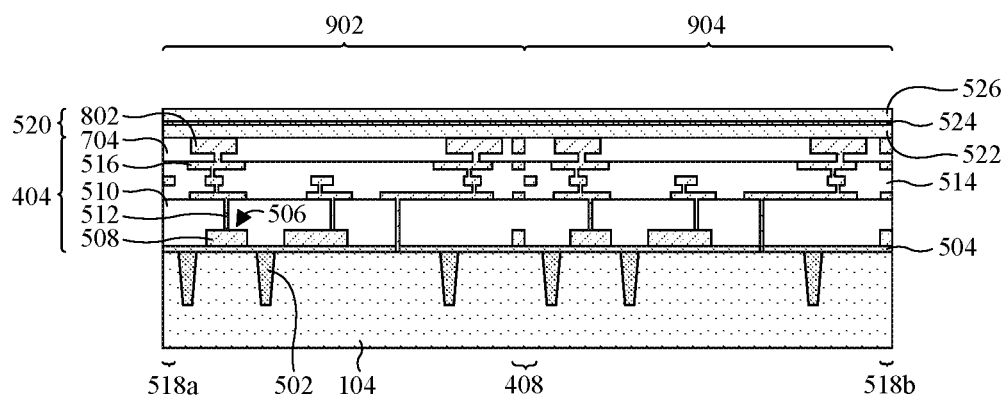

As shown in FIG. 9, a second passivation layer 520 is formed on the upper IMD layer 704 and the upper conductive features 802, the second passivation layer 520 having a first portion 902 and a second portion 904. In some embodiments, the first portion of the second passivation layer 902 is about vertically aligned with the first portion of the upper IMD layer 706 (see, e.g., FIG. 7). In further embodiments, the second portion of the second passivation layer 904 is about vertically aligned with the second portion of the upper IMD layer 708 (see, e.g., FIG. 7).

In some embodiments, a process for forming the second passivation layer 520 comprises depositing or growing a second dielectric layer 522 on the upper IMD layer 704 and the upper conductive features 802. In further embodiments, a third dielectric layer 524 is deposited or grown on the second dielectric layer 522, and a fourth dielectric layer 526 is deposited or grown on the third dielectric layer 524. In yet further embodiments, the second dielectric layer 522, the third dielectric layer 524, and the fourth dielectric layer 526 may be deposited or grown by CVD, PVD, ALD, thermal oxidation, sputtering, some other deposition or growth process, or a combination of the foregoing.

Figure 10:
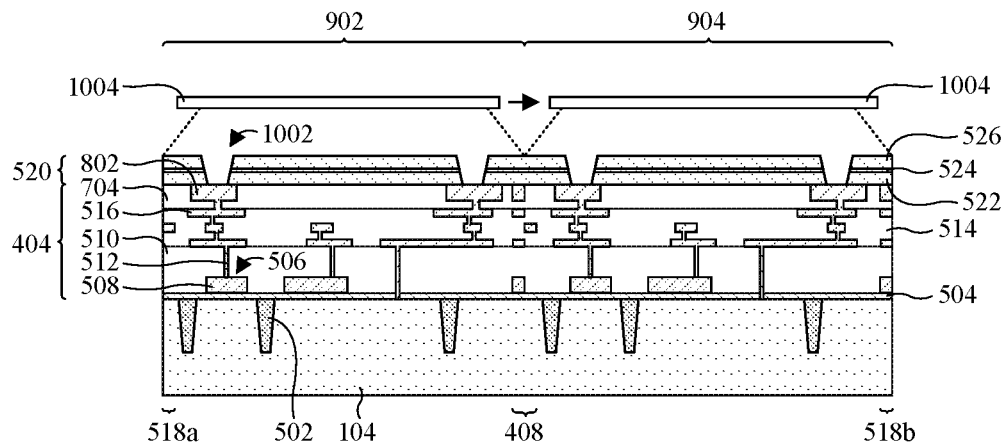

As shown in FIG. 10, a plurality of conductive via openings 1002 are formed in the second passivation layer 520. In some embodiments, a process for forming the plurality of conductive via openings 1002 comprises performing a second patterning process on the second passivation layer 520. In further embodiments, the second patterning process is substantially the same as the first passivation process, but utilizes a fourth reticle 1004 instead of the third reticle 710 to project a fourth image field onto a fourth masking layer (not shown). The second patterning process removes unmasked portions of the second passivation layer 520, thereby forming the conductive via openings 1002 in the second passivation layer 520.

In some embodiments, the fourth reticle 1004 has a fourth maximum image field size that is less than about 2,500 mm². More specifically, the fourth maximum image field size may be less than or equal to about 858 mm². In such embodiments, the fourth maximum image field size may have a maximum x-axis dimension less than or equal to about 26 mm and a maximum y-axis dimension (e.g., perpendicular to the x-axis dimension) less than or equal to about 33 mm. In further embodiments, the fourth maximum image field size may be substantially the same as the first maximum image field size and/or the third maximum image field size.

In some embodiments, the fourth reticle 1004 projects a fourth minimum feature size that is less than about 0.5 μm. More specifically, the fourth minimum feature size may be less than about 45 nm. In further embodiments, the fourth minimum feature size is substantially the same as first minimum feature size and/or the third minimum feature size.

Figure 11:
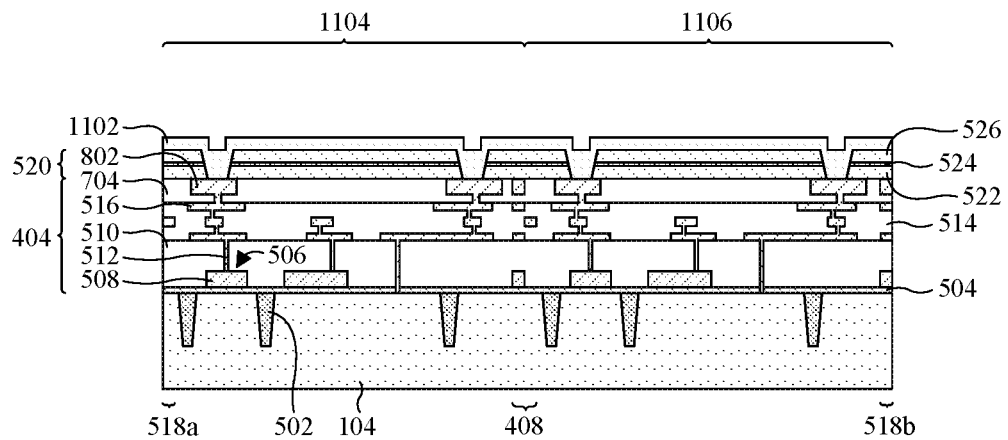

As shown in FIG. 11, a first conductive layer 1102 is formed on the second passivation layer 520 and at least partially filling the plurality of conductive via openings 1002 (see, e.g., FIG. 10). In some embodiments, a first portion of the first conductive layer 1104 is about vertically aligned with the first portion of the second passivation layer 902 (see, e.g., FIG. 10). In further embodiments, a second portion of the first conductive layer 1106 is about vertically aligned with the second portion of the second passivation layer 904 (see, e.g., FIG. 10). In further embodiments, the first conductive layer 1102 may be formed by, for example, CVD, PVD, ALD, sputtering, electrochemical plating, electroless plating, some other deposition process, or a combination of the foregoing. In yet further embodiments, the first conductive layer 1102 may comprise, for example, aluminum (Al), copper (Cu), tungsten (W), gold (Au), or the like.

Figure 12:
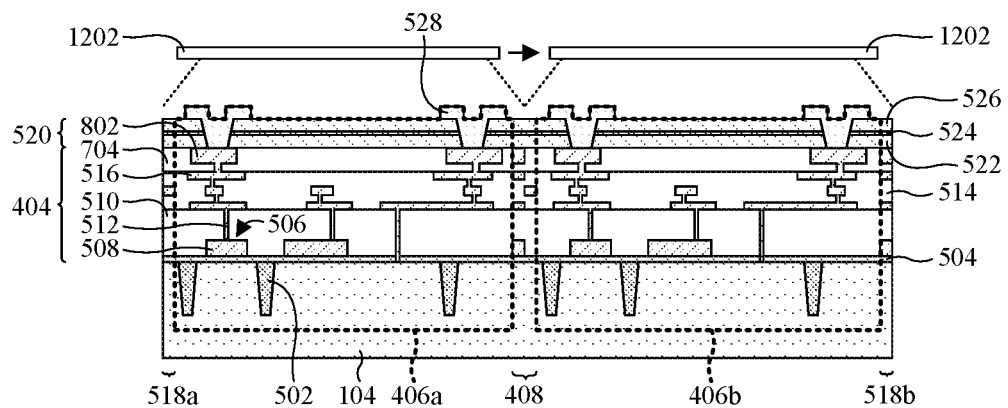

As shown in FIG. 12, a plurality of conductive vias 528 are formed over/within the second passivation layer 520. In some embodiments, formation of the conductive vias 528 completes formation of a first ICU 406a and a second ICU 406b. In some embodiments, a process for forming the plurality of conductive vias 528 comprises performing a third patterning process on the first conductive layer 1102 (see, e.g., FIG. 11). In further embodiments, the third patterning process is substantially the same as the first passivation process, but utilizes a fifth reticle 1202 instead of the third reticle 710 to project a fifth image field onto a fifth masking layer (not shown). The third patterning process removes unmasked portions of the first conductive layer 1102, thereby forming the conductive vias 528 over/within the second passivation layer 520.

In some embodiments, the fifth reticle 1202 has a fifth maximum image field size that is less than about 2,500 mm². More specifically, the fifth maximum image field size may be less than or equal to about 858 mm². In such embodiments, the fifth maximum image field size may have a maximum x-axis dimension less than or equal to about 26 mm and a maximum y-axis dimension (e.g., perpendicular to the x-axis dimension) less than or equal to about 33 mm. In further embodiments, the fifth maximum image field size may be substantially the same as the first, third, and/or fourth maximum image field size.

In some embodiments, the fifth reticle 1202 projects a fifth minimum feature size that is less than about 0.5 μm. More specifically, the fifth minimum feature size may be less than about 45 nm. In further embodiments, the fifth minimum feature size is substantially the same as the first, third, and/or fourth minimum feature size.

Figure 13:
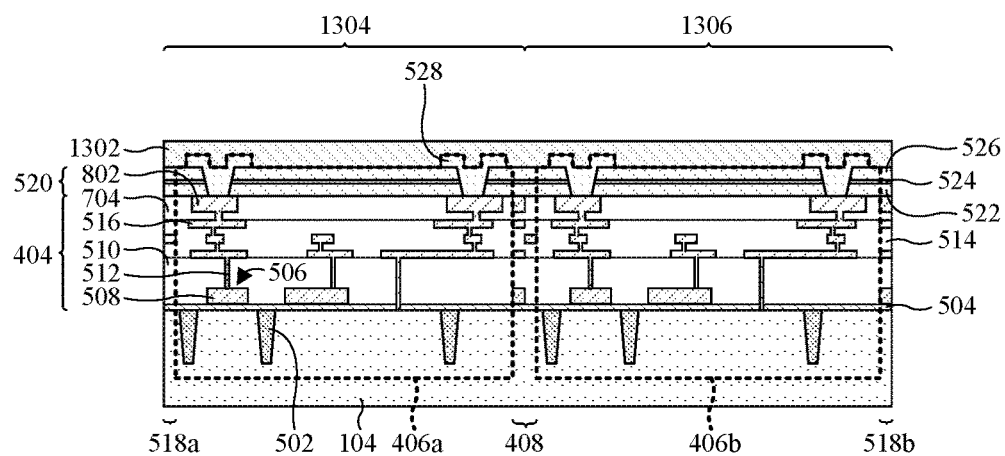

As shown in FIG. 13, a dielectric layer 1302 is formed over the second passivation layer 520 and the plurality of conductive vias 528, the dielectric layer 1302 having a first portion 1304 and a second portion 1306. In some embodiments, the first portion of the dielectric layer 1304 is about vertically aligned with the first portion of the second passivation layer 902 (see, e.g., FIG. 9). In further embodiments, the second portion of the dielectric layer 1306 is about vertically aligned with the second portion of the second passivation layer 904 (see, e.g., FIG. 9). In further embodiments, a process for forming the dielectric layer 1302 comprises depositing or grown the first passivation layer 102 by CVD, PVD, ALD, thermal oxidation, sputtering, some other deposition or growth process, or a combination of the foregoing. In yet further embodiments, the dielectric layer 1302 may comprise, for example, an oxide (e.g., $SiO_2$), a nitride (e.g., SiN), an oxy-nitride (e.g., $SiO_xN_y$), or the like.

Figure 14:
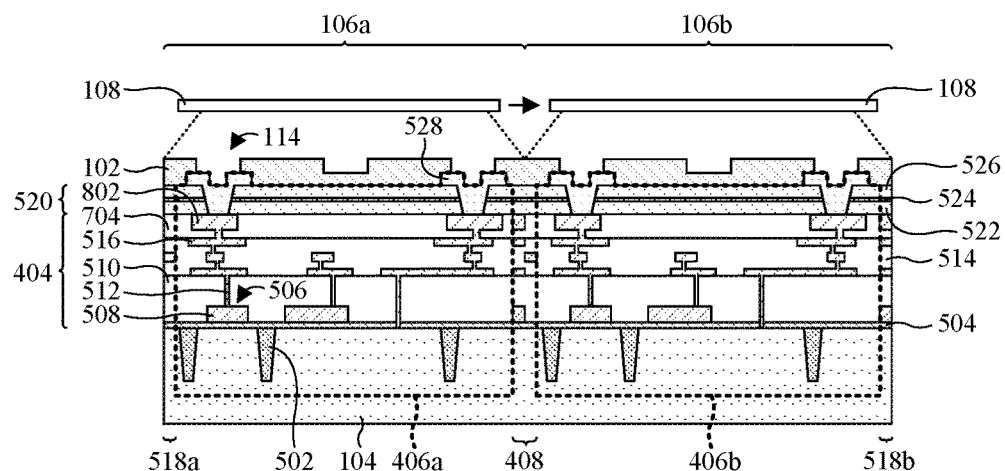

As shown in FIG. 14, a first passivation layer 102 having a plurality of openings 114 is formed on the second passivation layer 520 and the plurality of conductive vias 528, the first passivation layer 102 having a first portion 106a and a second portion 106b. In some embodiments, the first portion of the first passivation layer 106a corresponds to the first portion of the dielectric layer 1304 (see, e.g., FIG. 13). In further embodiments, the second portion of the first passivation layer 106b corresponds to the second portion of the dielectric layer 1306 (see, e.g., FIG. 9).

In some embodiments, a process for forming the first passivation layer 102 comprises performing a fourth patterning process on the dielectric layer 1302 (see, e.g., FIG. 13). In further embodiments, the fourth patterning process is substantially the same as the first passivation process, but utilizes a first reticle 108 instead of the third reticle 710 to project a first image field onto a first masking layer (not shown). The fourth patterning process removes unmasked portions of the dielectric layer 1302, thereby forming the first passivation layer 102 having the plurality of openings disposed therein.

In some embodiments, the first reticle 108 has a first maximum image field size that is less than about 2,500 mm². More specifically, the first maximum image field size may be less than or equal to about 858 mm². In such embodiments, the first maximum image field size may have a maximum x-axis dimension less than or equal to about 26 mm and a maximum y-axis dimension (e.g., perpendicular to the x-axis dimension) less than or equal to about 33 mm. In further embodiments, the first maximum image field size may be substantially the same as the as the first, third, fourth, and/or fifth maximum image field size.

In some embodiments, the first reticle 108 projects a first minimum feature size that is less than about 0.5 μm. More specifically, the first minimum feature size may be less than about 45 nm. In further embodiments, the first minimum feature size is substantially the same as the first, third, fourth, and/or fifth minimum feature size.

Figure 15:
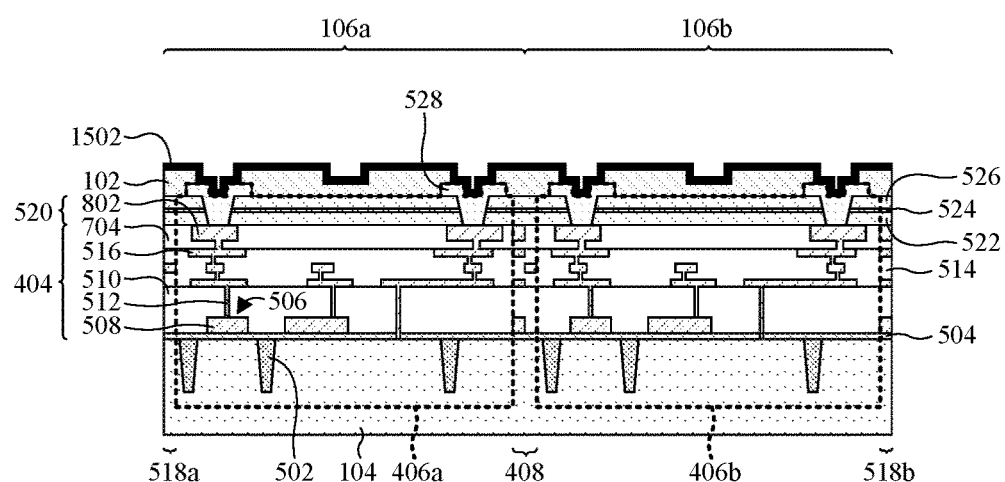

As shown in FIG. 15, a second conductive layer 1502 is formed over the first passivation layer 102 and the conductive vias 528. In some embodiments, a process for forming the second conductive layer 1502 comprises depositing the second conductive layer 1502 on the first passivation layer 102 and at least partially in the openings 114 of the first passivation layer 102. In further embodiments, the second conductive layer 1502 is deposited as a continuously layer that extends over the first portion 106*a* and the second portion of the first passivation layer 106*b*. In further embodiments, the second conductive layer 1502 may be deposited by, for example, CVD, PVD, ALD, sputtering, electrochemical plating, electroless plating, some other deposition process, or a combination of the foregoing. In yet further embodiments, the second conductive layer 1502 may comprise, for example, aluminum (Al), copper (Cu), tungsten (W), gold (Au), some other conductive material, or a combination of the foregoing.

Figure 16:
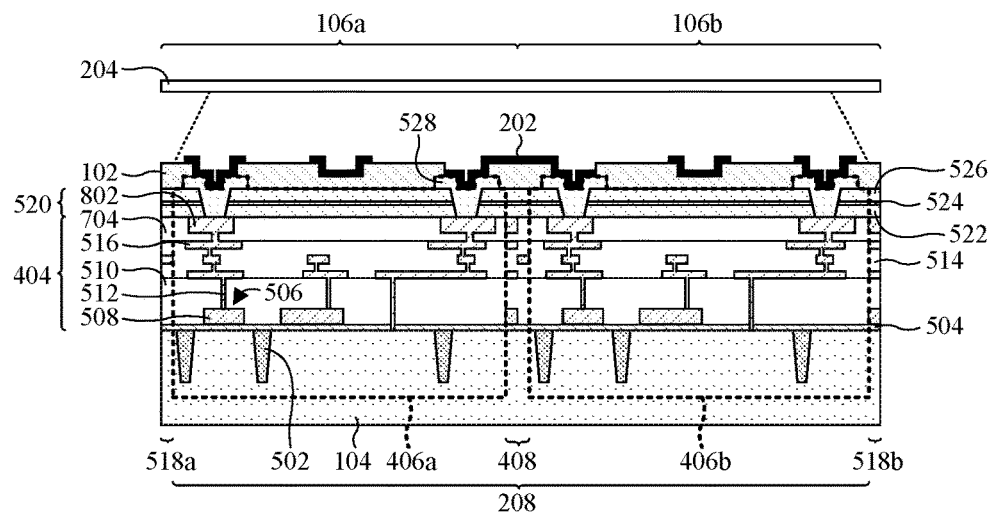

As shown in FIG. 16, a plurality of patterned conductive layers 202 are formed on the first passivation layer 102 and the conductive vias 528. In some embodiments, at least one of the patterned conductive layers 202 electrically couples the first ICU 406*a* to the second ICU 406*b* by bridging a region of the first passivation layer 102 disposed between the first ICU 406*a* and the second ICU 406*b*. In further embodiments, the region of the first passivation layer 102 disposed between the first ICU 406*a* and the second ICU 406*b* is disposed over an isolation region 408 that electrically isolates the first ICU 406*a* from the second ICU 406*b*. In yet further embodiments, the patterned conductive layers 202 are redistribution layers (RDLs).

In some embodiments, a process for forming the patterned conductive layers 202 comprises performing a fifth patterning process on the second conductive layer 1502 (see, e.g., FIG. 15). In further embodiments, the fifth patterning process comprises forming a second masking layer (not shown) (e.g., a negative/positive photoresist) on the second conductive layer 1502. The second masking layer may be formed by, for example, a spin-on process.

A second reticle 204 having a second maximum image field size is positioned at a third location over the second masking layer, the second maximum image field size being a maximum area that the second reticle 204 may expose to radiation while projecting a second minimum feature size. In some embodiments, the second maximum field size is greater than about 858 mm². In such embodiments, the second maximum image field size may have a minimum x-axis dimension greater than about 26 mm and a minimum y-axis dimension (e.g., perpendicular to the x-axis dimension) greater than about 33 mm. In further embodiments, the second maximum field size may be greater than or equal to about 2,500 mm². In such embodiments, the second maximum image field size may have a minimum x-axis dimension greater than or equal to about 50 mm and a minimum y-axis dimension (e.g., perpendicular to the x-axis dimension) greater than or equal to about 50 mm. In further embodiments, the second minimum feature size may be greater than or equal to about 0.5 μm. In yet further embodiments, the second minimum feature size may be greater than the first, third, fourth, and fifth minimum feature size.

Thereafter, radiation is passed through the second reticle 204 at the third location, such that a second image field covering a majority of the first portion 106*a* and a majority of the second portion of the first passivation layer 106*b* is projected onto a first portion of the second masking layer. The second image field comprises a second defined pattern of radiation having the second minimum feature size. The radiation reacts with the second masking layer, such that regions of the second making layer exposed to the radiation are more (or less) soluble in a developing agent than regions of the second masking layer that are not exposed to the radiation.

In some embodiments, a size/shape of the first portion of the second masking layer corresponds to the second maximum field size projected onto the second masking layer at the third location. In further embodiments, the first portion of the second masking layer covers a majority of the first portion 106*a* and a majority of the second portion of the first passivation layer 106*b*. In further embodiments, the first portion of the second masking layer has a perimeter that is enclosed by a combined perimeter of the first portion 106*a* and the second portion of the first passivation layer 106*b*. In other embodiments, the perimeter of the first portion of the second making layer is about vertically aligned with the combined perimeter of the first portion 106*a* and the second portion of the first passivation layer 106*b*.

Thereafter, the second masking layer is developed by exposing the second masking layer to the developing agent to remove portions of the second masking layer that were exposed (or not exposed) to the radiation. An etching process (e.g., wet or dry etching) is then performed to remove unmasked portions of the second conductive layer 1502 (e.g., portions not covered by the developed second masking layer), thereby forming the plurality of patterned conductive layers 202. Subsequently, the remaining portions of the second masking layer are stripped from the patterned conductive layers 202.

Figure 17:
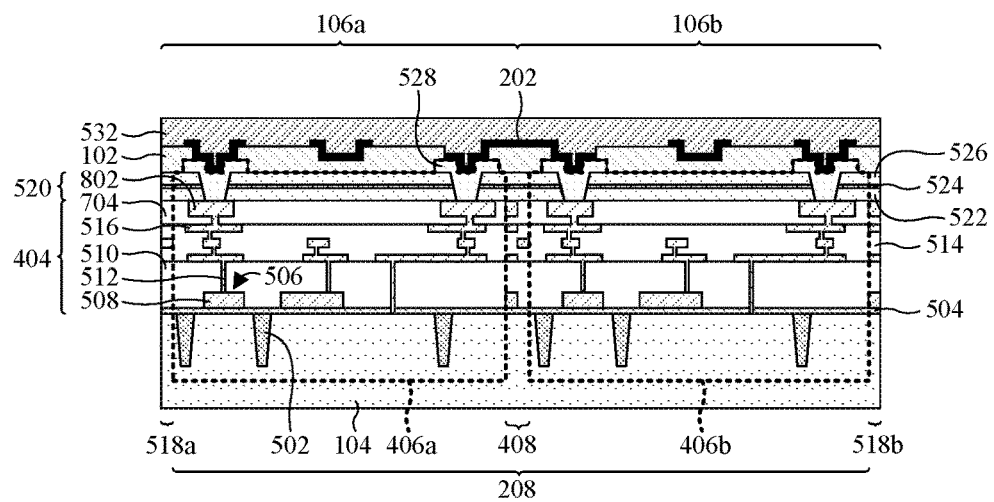

As shown in FIG. 17, a third passivation layer 532 is formed over the first passivation layer 102 and the patterned conductive layers 202. In some embodiments, the third passivation layer 532 may be formed with a substantially planar upper surface. In further embodiments, a process for forming the third passivation layer 532 may comprise depositing or growing the third passivation layer 532 by CVD, PVD, ALD, thermal oxidation, sputtering, some other deposition or growth process, or a combination of the foregoing. In yet further embodiments, formation of the third passivation layer 532 completes formation of the large field IC 208.

By forming the patterned conductive layers 202 with the second image field 206, the large field ICs 208 may be formed without overlapping the first image field projected at the first location with the first image field projected at the second location. Thus, the large field ICs 208 may be formed without a field stitching process (or by reducing a number of field stitching process(es) needed to form the large field ICs 208). Accordingly, the cycle time for forming the large field ICs 208 may be reduced. In addition, because the large field ICs 208 may be formed without the field stitching process, minimum features sizes may not needed to be relaxed to compensate for the field stitching process. Accordingly, the density of semiconductor devices on the large field IC may be increased.

Figure 18:
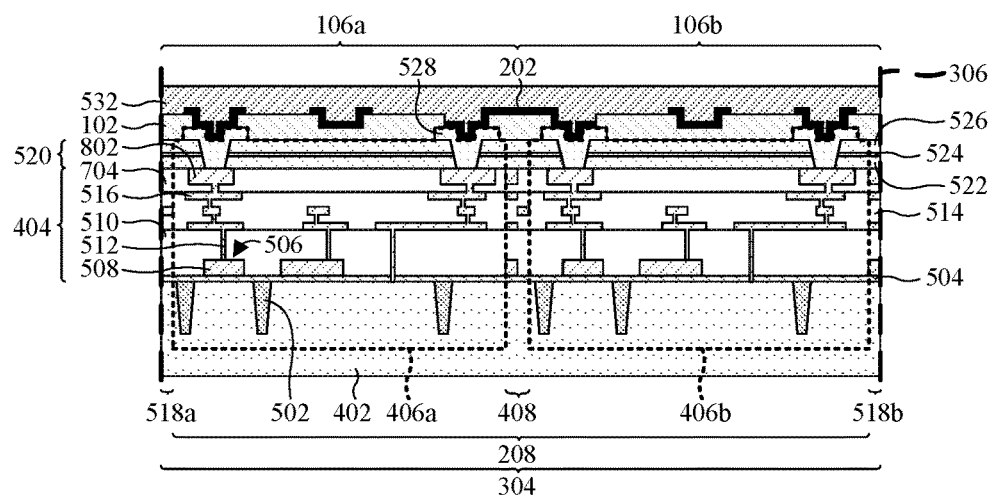

As shown in FIG. 18, a large field die 304 is formed by singulating the large field IC 208 from a semiconductor wafer 104 (see, e.g., FIG. 17). In some embodiments, the large field die 304 comprises the large field IC 208 disposed on a semiconductor substrate 402. In further embodiments, a process for forming the large field die 304 comprises performing a series of cuts into the semiconductor wafer 104 to form a plurality of scribe lines 306. Subsequently, a mechanical force is applied to the semiconductor wafer 104 to singulate the large field die 304 from the semiconductor wafer 104. In further embodiments, the cut may be performed by, for example, mechanical sawing, laser cutting, or the like.

Figure 19:
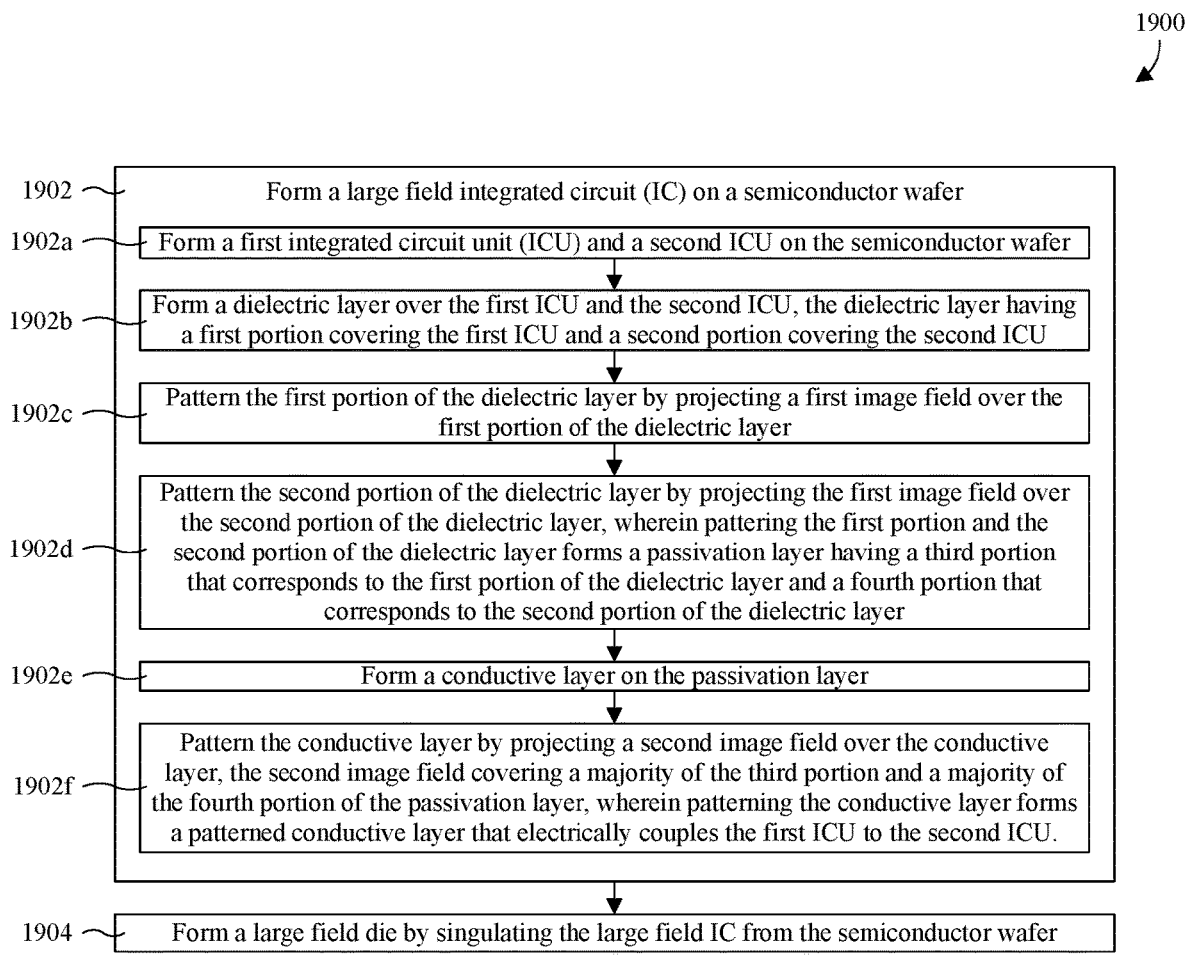
FIG. 19 illustrates a flowchart of some embodiments of a method for forming a large field die with reduced cycle time.

As illustrated in FIG. 19, a flowchart 1900 of some embodiments of a method for forming a large field die with reduced cycle time is provided. While the flowchart 1900 of FIG. 19 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1902, a large field integrated circuit (IC) is formed on a semiconductor wafer. FIGS. 7-17 illustrate a series of cross-sectional view of some embodiments corresponding to act 1902.

At 1902a, to form the large field IC, a first integrated circuit unit (ICU) and a second integrated circuit are formed on the semiconductor wafer. FIGS. 7-12 illustrate a series of cross-sectional view of some embodiments corresponding to act 1902a.

At 1902b, a dielectric layer is formed over the first ICU and the second ICU, the first dielectric layer having a first portion covering the first ICU and a second portion covering the second ICU. FIG. 13 illustrates a cross-sectional view of some embodiments corresponding to act 1902b.

At 1902c, the first portion of the dielectric layer is patterned by projecting a first image field over the first portion of the dielectric layer. FIG. 14 illustrates a cross-sectional view of some embodiments corresponding to act 1902c.

At 1902d, the second portion of the dielectric layer is patterned by projecting the first image field over the second portion of the dielectric layer, where patterning the first portion and the second portion of the dielectric layer forms a passivation layer having a third portion that corresponds to the first portion of the dielectric layer and a fourth portion that corresponds to the second portion of the dielectric layer. FIG. 14 illustrates a cross-sectional view of some embodiments corresponding to act 1902d.

At 1902e, a conductive layer is formed on the passivation layer. FIG. 15 illustrates a cross-sectional view of some embodiments corresponding to act 1902e.

At 1902f, the conductive layer is patterned by projecting a second image field over the conductive layer, the second image field covering a majority of the third portion and a majority of the fourth portion of the passivation layer. A patterned conductive layer that electrically couples the first ICU to the second ICU is formed by patterning the conductive layer. FIG. 16 illustrates a cross-sectional view of some embodiments corresponding to act 1902f.

At 1904, a large field die is formed by singulating the large field IC from the semiconductor wafer. FIG. 18 illustrates a cross-sectional view of some embodiments corresponding to act 1904.

In some embodiments, the present application provides a method for forming an integrated circuit. The method includes forming a first layer over a semiconductor wafer, the first layer having a first portion and a second portion. The first portion of the first layer is patterned by passing radiation through a first reticle to project a first image field over the first portion of the first layer, where the first portion of the first layer corresponds to the first image field. The second portion of the first layer is patterned by passing radiation through a second reticle to project a second image field over the second portion of the first layer, where the second portion of the first layer corresponds to the second image field. A second layer is formed over the first layer. The second layer is patterned by passing radiation through a third reticle to project a third image field over the second layer, where the third image field covers a majority of the first portion and a majority of the second portion of the first layer.

In other embodiments, the present application provides a method for forming an integrated circuit. The method includes forming a first integrated circuit unit (ICU) on a first region of a semiconductor wafer by passing radiation through a first reticle to project a first image field toward the first region of the semiconductor wafer, where the first region of the semiconductor wafer corresponds to a maximum image field size of the first reticle. A second ICU is formed on a second region of the semiconductor wafer by passing radiation through a second reticle to project a second image field toward the second region of the semiconductor wafer, where the second region of the semiconductor wafer corresponds to a maximum image field size of the second reticle, and where an isolation region separates and electrically isolates the first ICU from the second ICU. A passivation layer is formed over the first ICU, the isolation region, and the second ICU. A conductive layer is formed over the passivation layer. The conductive layer is patterned by passing radiation through a third reticle to project a third image field toward the semiconductor wafer, where the third image field covers a majority of the first region and a majority of the second region of the semiconductor wafer.

In yet other embodiments, the present application provides an integrated circuit. The integrated circuit includes a semiconductor substrate. A first integrated circuit unit (ICU) is disposed over a first region of the semiconductor substrate. A second ICU is disposed over a second region of the semiconductor substrate. An isolation region is disposed between the first ICU and the second ICU, where the isolation region electrically isolates the first ICU from the second ICU. A passivation layer covers the first ICU, the isolation region, and the second ICU. A patterned conductive layer is disposed over the passivation layer and electrically couples the first ICU to the second ICU, where the patterned conductive layer electrically couples the first ICU to the second ICU by bridging a portion of the passivation layer covering the isolation region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit, the method comprising:
    forming a first layer over a semiconductor wafer, the first layer having a first portion and a second portion;
    patterning the first portion of the first layer, wherein patterning the first portion of the first layer comprises passing radiation through a first reticle to project a first image field over the first portion of the first layer, wherein a first size of the first portion of the first layer corresponds to a second size of the first image field;
    patterning the second portion of the first layer, wherein patterning the second portion of the first layer comprises passing radiation through a second reticle to project a second image field over the second portion of the first layer, wherein a third size of the second portion of the first layer corresponds to a fourth size of the second image field;
    forming a second layer over the first layer; and
    patterning the second layer, where patterning the second layer comprises passing radiation through a third reticle to project a third image field over the second layer, and wherein the third image field covers a majority of the first portion and a majority of the second portion of the first layer.

2. The method of claim 1, wherein a region of the patterned second layer continuously extends along the first layer from the first portion of the first layer to the second portion of the first layer.

3. The method of claim 1, wherein the patterned second layer electrically couples a first conductive via disposed beneath an upper surface of the first portion of the first layer to a second conductive via disposed beneath an upper surface of the second portion of the first layer.

4. The method of claim 1, wherein:
    the first image field comprises a first minimum feature size;
    the second image field comprises a second minimum feature size; and
    the third image field comprises a third minimum feature size, the third minimum feature size being greater than the first minimum feature size and the second minimum feature size.

5. The method of claim 1, further comprising:
    forming an inter-metal dielectric (IMD) layer over the semiconductor wafer, wherein the first layer is formed over the IMD layer.

6. The method of claim 5, further comprising:
    forming a first passivation layer on the IMD layer, wherein the first passivation layer is disposed between the first layer and the IMD layer.

7. The method of claim 6, wherein the first layer is a second passivation layer that is formed on the first passivation layer.

8. The method of claim 7, wherein the second layer is formed on the second passivation layer, and wherein patterning the second layer forms a patterned second layer that electrically couples a first conductive via disposed beneath the first portion of the first layer to a second conductive via disposed beneath the second portion of the first layer.

9. The method of claim 8, wherein forming the first passivation layer comprises:
    forming a dielectric layer on an upper surface of the IMD layer, the dielectric layer having a third portion and a fourth portion that are about vertically aligned with the first portion and the second portion of the first layer, respectively;
    patterning the third portion of the dielectric layer to form a first via opening in the third portion of the dielectric layer, wherein patterning the third portion comprises passing radiation through a fourth reticle to project a fourth image field over the third portion, wherein a fifth size of the third portion of the dielectric layer corresponds to a sixth size of the fourth image field; and
    patterning the fourth portion of the dielectric layer to form a second via opening in the fourth portion of the dielectric layer, wherein patterning the fourth portion comprises passing radiation through a fifth reticle to project a fifth image field over the fourth portion, wherein a seventh size of the fourth portion of the dielectric layer corresponds to an eighth size of the fifth image field.

10. The method of claim 9, wherein forming the first conductive via and the second conductive via comprises:
    forming a conductive layer that fills both the first via opening and the second via opening over the first passivation layer, the conductive layer having a fifth portion and a sixth portion that are about vertically aligned with the third portion and the fourth portion of the dielectric layer, respectively;
    patterning the fifth portion of the conductive layer to form the first conductive via, wherein patterning the fifth portion comprises passing radiation through a sixth reticle to project a sixth image field over the fifth portion, wherein a ninth size of the fifth portion of the conductive layer corresponds to a tenth size of the sixth image field; and
    patterning the sixth portion of the conductive layer to form the second conductive via, wherein patterning the sixth portion comprises passing radiation through a seventh reticle to project a seventh image field over the sixth portion, wherein an eleventh size of the sixth portion of the conductive layer corresponds to a twelfth size of the seventh image field.

11. A method for forming an integrated circuit, the method comprising:
    forming a first integrated circuit unit (ICU) on a first region of a semiconductor wafer by passing radiation through a first reticle to project a first image field toward the first region of the semiconductor wafer, wherein a first size of the first region of the semiconductor wafer corresponds to a maximum image field size of the first reticle;
    forming a second ICU on a second region of the semiconductor wafer by passing radiation through a second reticle to project a second image field toward the second region of the semiconductor wafer, wherein a second size of the second region of the semiconductor wafer corresponds to a maximum image field size of the second reticle, and wherein an isolation region separates and electrically isolates the first ICU from the second ICU;
    forming a passivation layer over the first ICU, the isolation region, and the second ICU;
    forming a conductive layer over the passivation layer; and
    patterning the conductive layer, wherein patterning the conductive layer comprises by-passing radiation through a third reticle to project a third image field toward the semiconductor wafer, wherein the third image field covers a majority of the first region and a majority of the second region of the semiconductor wafer.

12. The method of claim 11, wherein the patterned conductive layer electrically couples the first ICU to the second ICU.

13. The method of claim 12, wherein:
the first image field defines a minimum feature size of the first ICU;
the second image field defines a minimum feature size of the second ICU; and
the third image field defines a minimum feature size of the patterned conductive layer, wherein the minimum feature size of the patterned conductive layer is greater than both the minimum feature size of the first ICU and the minimum feature size of the second ICU.

14. The method of claim 13, wherein the minimum feature size of the first ICU is substantially the same as the minimum feature size of the second ICU.

15. The method of claim 14, wherein the first image field comprises a first pattern of radiation, and the second image field comprises a second pattern of radiation that is substantially the same as the first pattern of radiation.

16. The method of claim 15, wherein the patterned conductive layer electrically couples the first ICU to the second ICU by bridging a region of the passivation layer disposed over the isolation region.

17. The method of claim 16, wherein:
the first ICU comprises a first conductive via;
the second ICU comprises a second conductive via;
the region of the passivation layer disposed over the isolation region has an uppermost surface disposed over an uppermost surface of the first conductive via and an uppermost surface of the second conductive via; and
the patterned conductive layer extends vertically from the first conductive via, laterally along the uppermost surface of the region of the passivation layer disposed over the isolation region, and vertically toward the second conductive via.

18. The method of claim 17, further comprising:
singulating the integrated circuit from the semiconductor wafer to form a die, wherein the die comprises the first ICU, the isolation region, the second ICU, and the patterned conductive layer.

19. A method for forming an integrated circuit, the method comprising:
forming a first layer over a semiconductor wafer, wherein the first layer comprises a first region and a second region;
positioning a first reticle at a first location over the first layer, wherein the first reticle has a first maximum field size;
with the first reticle positioned at the first location, projecting a first image field having a first minimum feature size onto the first region via the first reticle, wherein a first size of the first region corresponds to the first maximum field size with the first reticle positioned at the first location;
positioning the first reticle at a second location over the first layer, wherein the second location is different than the first location;
with the first reticle positioned at the second location, projecting the first image field onto the second region of the first layer via the first reticle, wherein a second size of the second region corresponds to the first maximum field size with the first reticle positioned at the second location;
forming a second layer over the first layer, wherein the second layer at least partially covers both the first region and the second region;
positioning a second reticle at a third location over the second layer; and
with the second reticle positioned at the third location, projecting a second image field having a second minimum feature size onto the second layer via the second reticle, wherein the second minimum feature size is greater than the first minimum feature size, and wherein the second image field covers both a majority of the first region and a majority of the second region.

20. The method of claim 19, further comprising:
after the first image field is projected onto the first region, after the second image field is projected onto the second region, and before the second layer is formed, exposing the first layer to a first developing agent to selectively remove a first portion of the first layer from the first region and selectively remove a second portion of the first layer from the second region; and
after the second layer is formed, exposing the second layer to a second developing agent to selectively remove a third portion of the second layer.

* * * * *